(12) United States Patent
Faifer et al.

(10) Patent No.: US 7,642,772 B1
(45) Date of Patent: Jan. 5, 2010

(54) NON-CONTACT METHOD AND APPARATUS FOR MEASUREMENT OF LEAKAGE CURRENT OF P-N JUNCTIONS IN IC PRODUCT WAFERS

(75) Inventors: Vladimir Faifer, Mountain View, CA (US); Michael Current, San Jose, CA (US); Timothy Wong, Cupertino, CA (US)

(73) Assignee: Ahbee 1, L.P., San Jose, CA (US)

( * ) Notice: Subject to any disclaimer, the term of this patent is extended or adjusted under 35 U.S.C. 154(b) by 0 days.

(21) Appl. No.: 11/982,624

(22) Filed: Nov. 5, 2007

Related U.S. Application Data

(62) Division of application No. 10/688,766, filed on Oct. 15, 2003, now Pat. No. 7,362,088.

(51) Int. Cl.
*G01R 31/28* (2006.01)
(52) U.S. Cl. .................................... 324/158.1
(58) Field of Classification Search .............. 324/158.1, 324/750, 769, 501, 767, 765; 356/72, 369, 356/381, 445, 447; 438/14, 17–18
See application file for complete search history.

(56) References Cited

U.S. PATENT DOCUMENTS 5,442,297 A * 8/1995 Verkuil ...................... 324/702
6,466,040 B1 * 10/2002 Simon et al. ................ 324/752

* cited by examiner

*Primary Examiner*—Ha Tran T Nguyen
*Assistant Examiner*—Tung X Nguyen

(57) ABSTRACT

A non-contact apparatus and method for measuring of the leakage current and capacitance of p-n junctions in test structures within scribe lanes of IC product wafers is disclosed. The apparatus comprises of a light source optically coupled with a fiber to a transparent electrode at the end of the fiber, which is brought close to the p-n junction under test. The ac signal generated from the test p-n junction is captured by this transparent and conducting coating electrode. The leakage current of a test p-n junction is determined using the frequency dependence of junction photo-voltage signal and reference signals from a p-n junction with low leakage current and known capacitance.

8 Claims, 5 Drawing Sheets

NON-CONTACT METHOD AND APPARATUS FOR MEASUREMENT OF LEAKAGE CURRENT OF P-N JUNCTIONS IN IC PRODUCT WAFERS

RELATED APPLICATIONS

The present application Ser. No. 11/982,624 filed on Nov. 5, 2007 is a division of U.S. application Ser. No. 10/688,766 filed Oct. 15, 2003, now U.S. Pat. No. 7,362,088, Non Contact Method and Apparatus for Measurement of Sheet Resistance of P-N Junctions

BACKGROUND OF THE INVENTION

The present invention relates to the non-contact measurement of leakage current of p-n junctions in test structures located in the scribe lanes of IC product wafers using a junction photo-voltage (JPV) technique As the number of transistors per IC increases, the contribution to dynamic and standby power drains from transistor junction leakage currents poses increasing limitations to the implementation of advanced technology designs and a serious power drain for battery-powered systems. Many process factors associated with the fabrication of ultra-shallow junctions (USJ), with junction depths less than 30 nm, contribute to the increasing junction leakage current density as transistor size is scaled to smaller dimensions. Monitoring junction leakage current on in-process IC product wafers provides timely input for tuning manufacturing conditions to minimize leakage current levels.

The present invention provides a method and apparatus for non-contact measurements of p-n junction leakage current with spatial resolution (<100 um) consistent with the dimension of test structures in IC wafer scribe lanes.

SUMMARY OF THE INVENTION

An object of this invention is to provide a method and non-contact apparatus for the measurement of leakage current in p-n junctions located in test structures within the scribe lanes of IC product wafers. The present embodiment of the invention apparatus includes a means for illumination of these p-n junctions with intensity modulated light, an optical fiber with a transparent and conducting coating covering its end, positioned near the p-n junction surface, within a distance of less than 1 micrometer, directing light onto the junction surface, and detection and analysis of the JPV signal from the junction. The various embodiments of the invention apparatus can include an optical pattern recognition and wafer positioning system, the use of light-emitting diodes (LED) or laser diodes as light sources and dielectric coatings on the transparent electrode to provide a fixed probe-to-junction distance.

The invention also provides a non-contact method for measurement of the capacitance of p-n junctions. To obtain accurate measurements, the intensity of the light is adjusted to obtain a linear dependence of the JPV signal from the transparent electrode versus light flux.

This method provides for use of a calibration wafer containing a planar p-n diode with known capacitance. An implementation of the leakage current measurement method uses a comparison of JPV signals for test wafers and a calibration wafer.

An additional procedure of measurement includes illumination of a calibration p-n junction with known capacitance with intensity modulated light; measurement of the JPV signal from this p-n junction at one light modulation frequency; then measurement of the JPV signal from a test p-n junction using at least two light modulation frequencies; and determination of the leakage current of test wafers using measured JPV values from a test p-n junction at two or more frequencies and JPV values from a calibration wafer with a p-n junction with known capacitance.

The present invention also provides a means for increasing the accuracy and versatility of the measurement through several methods; providing a means for checking and adjusting the air gap separation between the probe electrodes and the p-n-junction to establish uniform and known capacitive coupling of the JPV signals, providing a photodiode detector to check the value and uniformity of the surface reflectivity and providing for the use of multiple wavelengths of excitation light to allow for optimal matching between the light penetration depth and junction depths of surface and sub-surface doped layers.

DETAILED DESCRIPTION OF THE APPARATUS AND METHOD

Figure 1:
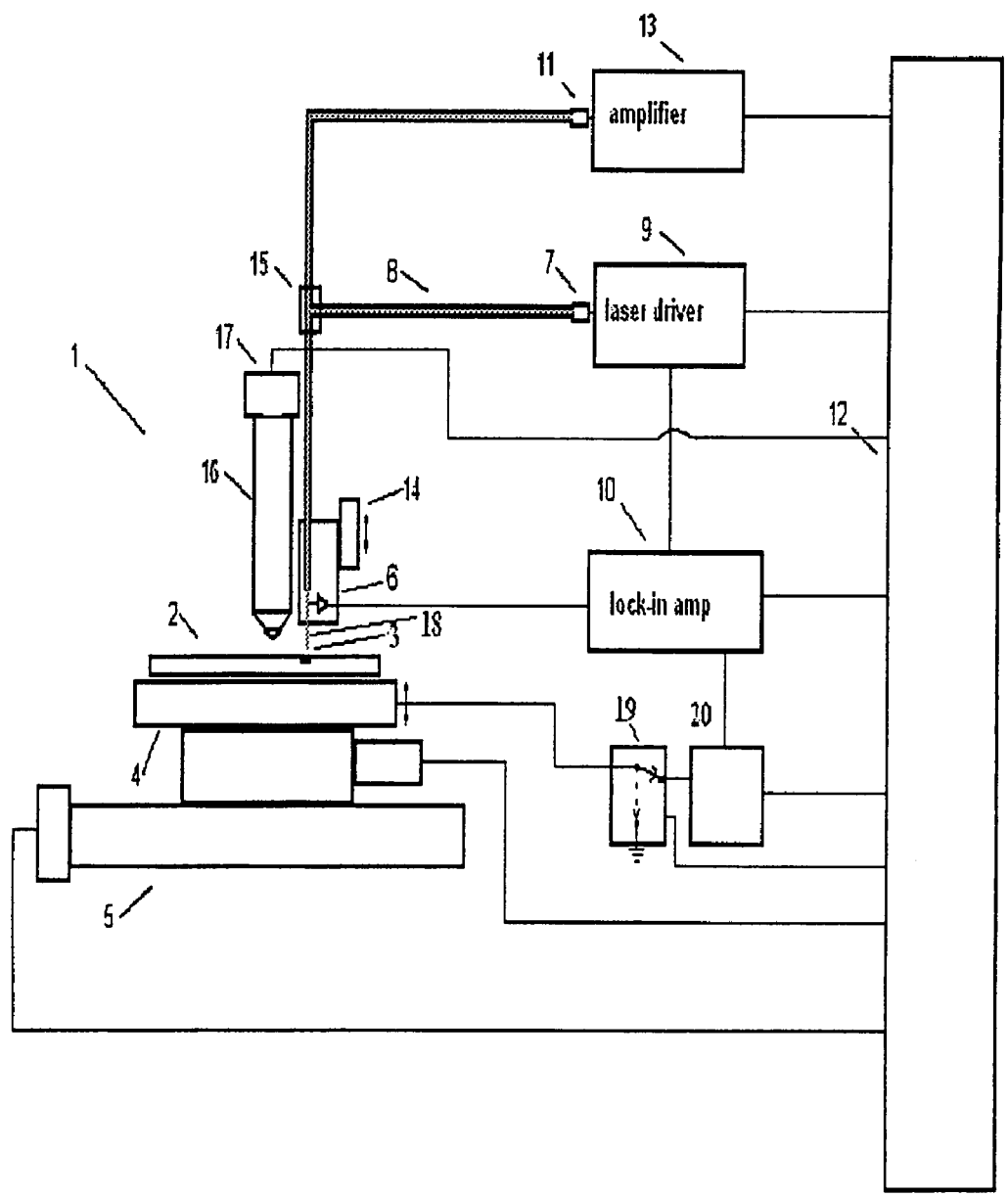
FIG. 1 is a pictorial view of the present embodiment of the invention.

In FIG. 1, a non-contact leakage current apparatus 1 is shown. A wafer 2, containing product IC devices and a test p-n junction 3, is located on a wafer chuck 4. The wafer chuck is placed on a precision motion stage 5. The apparatus comprises a probe 6 for leakage current (L) measurement. An electrode 18 is placed close to the junction surface 3 and is optically coupled to a modulated light source 7, connected to a driver supply 9, through an optical fiber 8. The electrical output of the JPV probe 6 is connected to a signal demodulator or lock-in amplifier 10. Signal demodulator 10 and motors of the stage 5 are electrically connected to an interface and a computer 12. The air gap distance between the probe electrode 18 and the p-n junction 3 is controlled through a vertical motion control device 14 to establish a known and uniform capacitive coupling for the JPV signal. The electrical gain of the probe 6 can also be controlled without adjustment of the probe-to-junction gap by use of a voltage supply 20 which can supply a modulated signal through a switch 19 to the wafer chuck 4 for calibration of the air gap distance with a known signal, measured in the absence of the modulated light beam. The optical fiber 8 also communicates the modulated probe light to the p-n junction 3 and back to a photodiode detector 11 and amplifier 13 through a fiber optic beam splitter 15 for measurement of the surface reflectivity.

The apparatus also comprises an optical system 16 with a CCD camera 17 for pattern recognition to provide a means of locating the probe electrode 18 over the test p-n junction diode 3. During leakage current measurements, the probe 18 and p-n junction 3 are placed a light-tight enclosure to avoid noise effects from additional photo-voltage signals created by light sources other than the modulated light source 7. The signal generator 20 and signal demodulators 10 may be replaced by a single lock-in amplifier with an internal signal generator.

Figure 2:
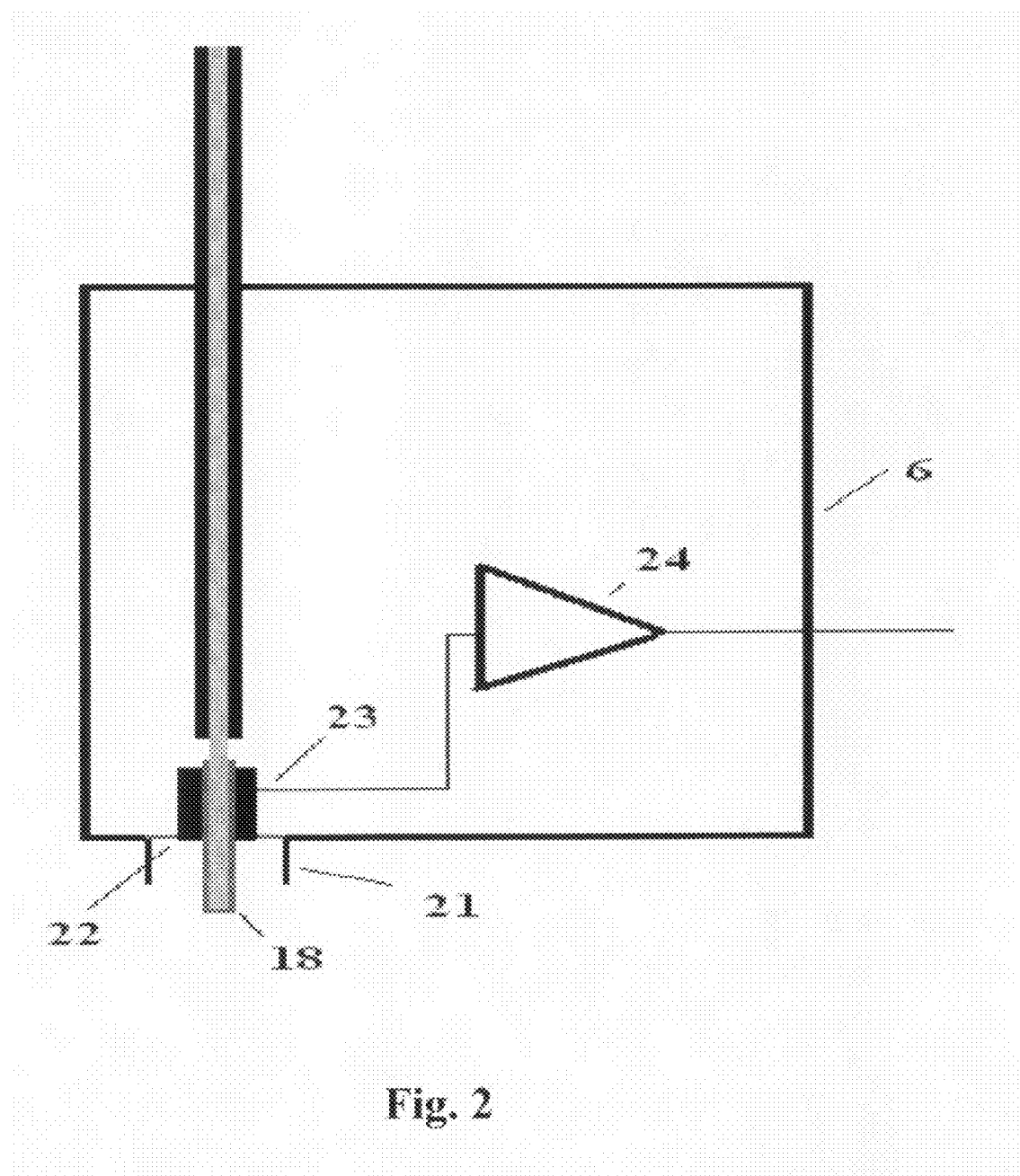
FIG. 2 is a pictorial view of a probe assembly.
Figure 3:
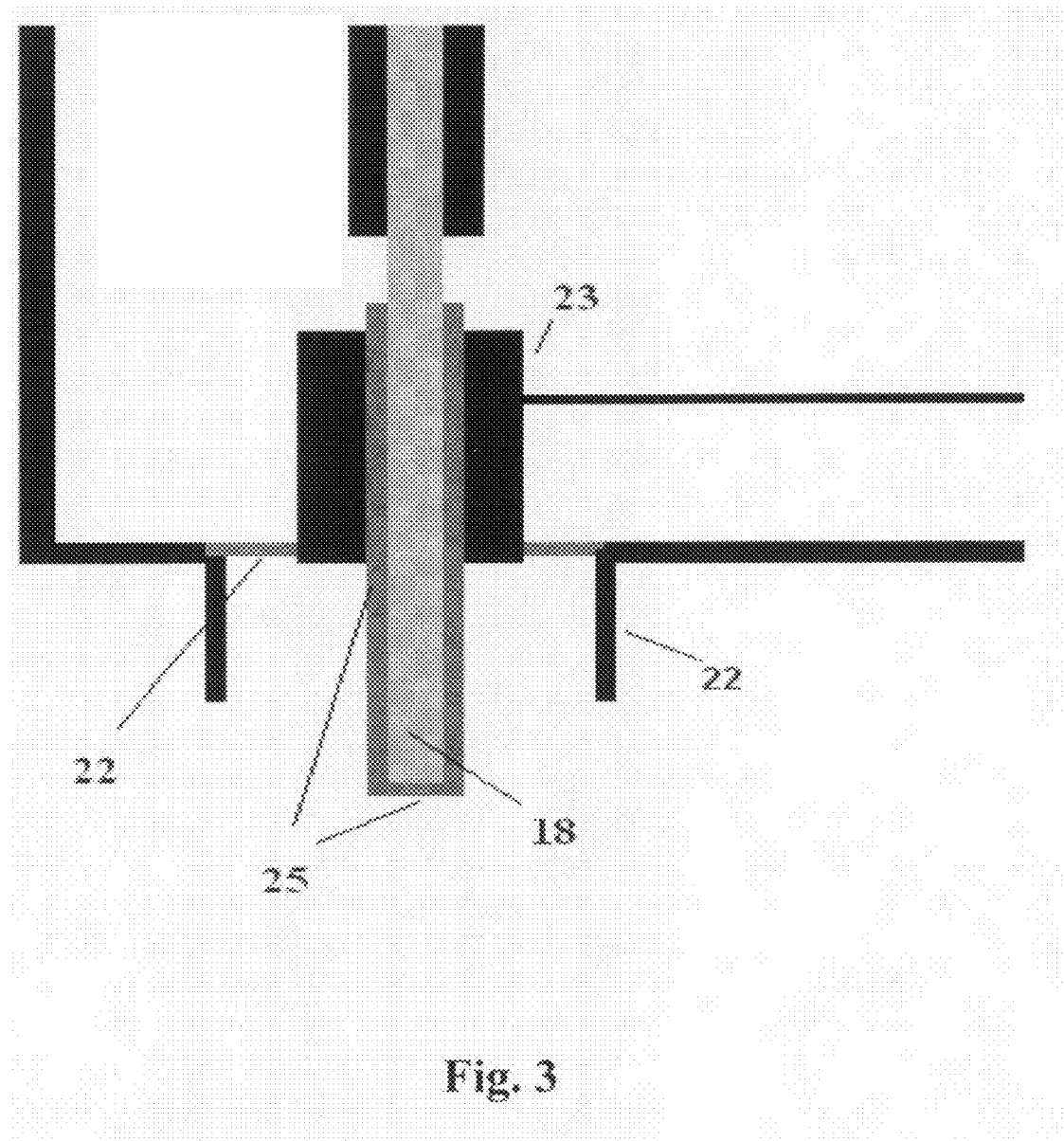
FIG. 3 is a pictorial view of the configuration of the probe's electrode.

The more detailed view of the probe 6, represented in FIG. 2 and FIG. 3, shows the optical fiber 8 with its end 18 coated with a transparent and conducting ITO (Indium-Tin-Oxide) layer 25. The conducting layer 25 is connected to a preamplifier 24 by a metal cylinder 23 installed inside a dielectric ring 22. The output of the signal preamplifier 24 is connected to a signal demodulator 10.

Figure 4:
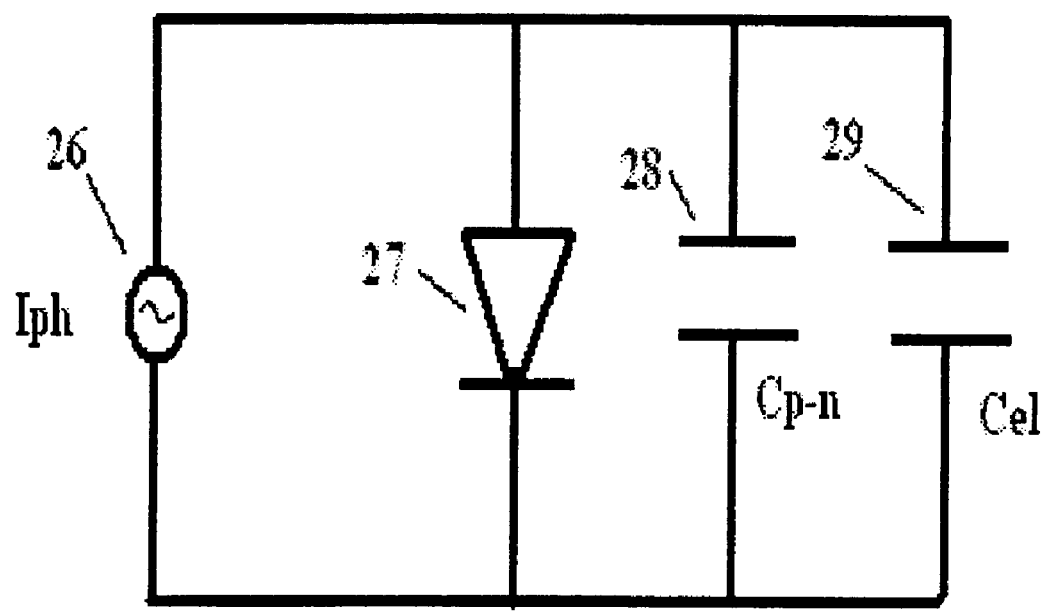
FIG. 4 is a pictorial view of equivalent electronic schematic of p-n junction under illumination.

The fundamentals of the measurement can be described using an equivalent circuit shown in FIG. 4, where Cel 29 is the capacitance of the probe electrode, Cp-n 28 is the junction capacitance, Iph 26 is the junction photo-current under illumination and the p-n junction diode 27, which can be approximated as a resistor for low to modest leakage conditions.

In the case of a sinusoidal modulated light, the junction photo-voltage (JPV) signal in the probe electrode can be represented as:

$$V_{SPV}(t) = V_S \cdot \exp(j\omega \cdot t) = |V_S| \exp(j\vartheta) \exp(j\omega \cdot t) \quad (1)$$

where $|V_S|$, $\vartheta$ are the magnitude and phase shift of JPV signal, $V_S$, $\omega = 2\pi f$, and f is the light modulating frequency.

The magnitude and phase shift of the photo-voltages are:

$$|V_S| = \frac{q(1-R)\Phi}{\sqrt{(2\pi f C_{pn})^2 + I_0^2(q/kT)^2}} \quad (2)$$

and $$\vartheta = \text{Arctan}\left[\frac{2\pi f C_{pn}}{I_0(q/kT)}\right] \quad (3)$$

where:

Φ is the intensity of the light flux on the junction surface;

Cp-n is the capacitance of p-n junction per unit area;

R is the reflectivity of the semiconductor surface.

Io is the prefactor in formula of current, I, versus voltage, V, of p-n junction:

$$I = _0 \cdot [\exp(q \cdot V/kT) - 1] \quad (4)$$

q is the charge of the electron;

k is Boltzman constant;

T is the measurement temperature.

This invention provides for the use of a junction capacitance calibration wafer to provide for an accurate measurement of leakage current independent of detailed information on the light intensity and surface reflectivity. The calibration wafer should have a surface p-n junction with low leakage current, $I_o*(q/kT) << 2\pi f_2 C_{sc}$, and a known value of p-n junction capacitance, $C_{pnc}$. In this case, the JPV signal for this calibration p-n junction can be determined using:

$$|V_c| = const \frac{q(1-R)\Phi}{2\pi f C_c} \quad (5)$$

Leakage for a test junction can be calculated using a set of equations:

$$\frac{|V|}{|V_c|} = \frac{2\pi f_0 C_c}{\sqrt{(2\pi f_0 C_{pn})^2 + I_0^2(q/kT)^2}} \quad (6)$$

and $$\vartheta = \text{Arctan}\left[\frac{2\pi f_0 C_{pn}}{I_0(q/kT)}\right] \quad (7)$$

In an alternative method, junction photo-voltages can be measured at two frequencies, $f_1$ and $f_2$, and the leakage current is calculated using the following set of equations:

$$\frac{|V_1|}{|V_c|} = \frac{2\pi f_1 C_C}{\sqrt{(2\pi f_1 C_{pn})^2 + I_0^2(q/kT)^2}} \quad (8)$$

$$\frac{|V_1|}{|V_2|} = \frac{\sqrt{(2\pi f_2 C_{pn})^2 + I_0^2(q/kT)^2}}{\sqrt{(2\pi f_1 C_{pn})^2 + I_0^2(q/kT)^2}} \quad (9)$$

Figure 5:
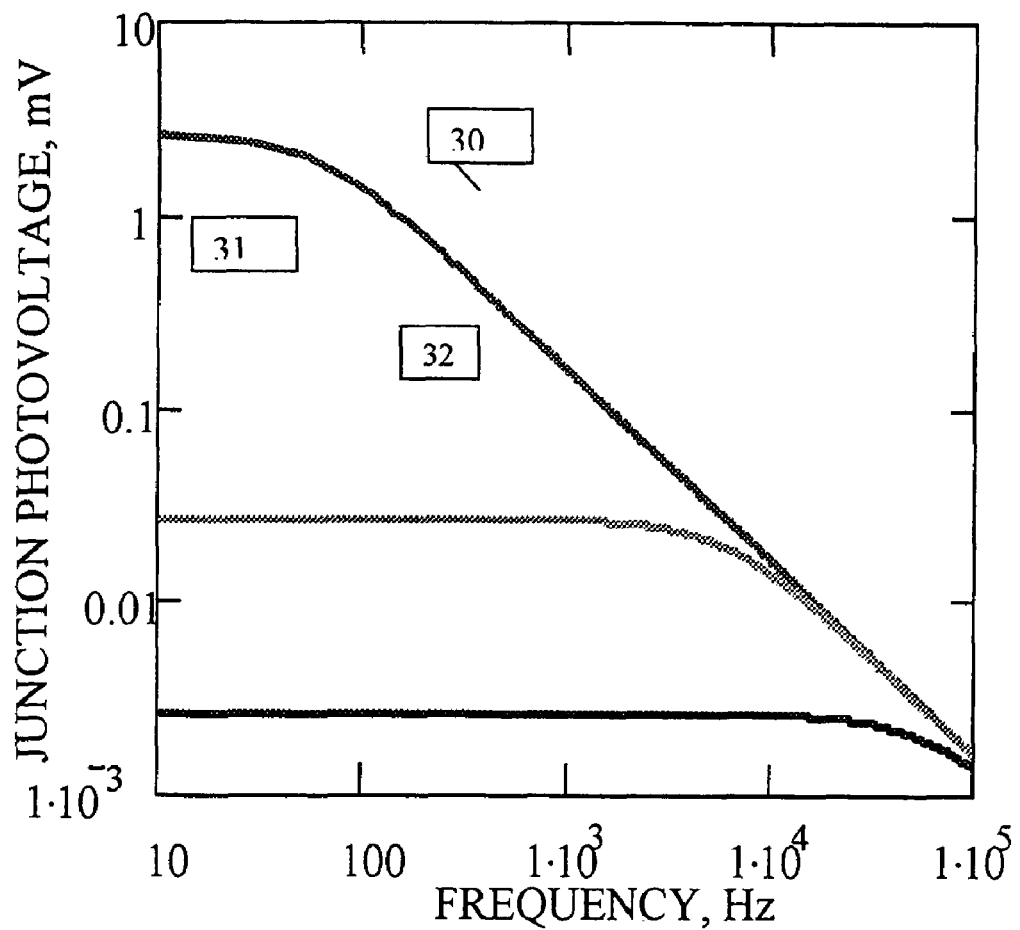
FIG. 5 is a pictorial view of junction photo-voltage dependencies for leaky and not leaky p-n junctions.

As depicted in FIG. 5, the light modulation frequency dependence of the junction photo-voltage (JPV) has region of strong like 1/f dependence if f>fc and at a nearly constant and sharply reduced value JPV for f<fc, where the cutoff frequency, fc, is [qIo/2πkTCpn]. For low-leakage junctions 30, the 1/f behavior extends over a wide range of frequencies and the cutoff frequency is low, near 100 Hz in the example. For increasing leakage current, shown in the behaviors 31, 32, the low and constant voltage signal extends to higher frequencies and the cutoff frequency increases with increasing leakage.

For the best accuracy of this alternative method, the measurement frequencies should be chosen so that $f_1 < fc$ and $f_2 > fc$. For the first, single frequency method, the best signal accuracy is obtained by using a light modulation frequency close to the cutoff value, $fo \approx fc$.

To exclude errors related to wafers thickness differences, or change of the air gap due to differential thermal expansion of different components, an air gap control system is used to maintain a constant air gap or to monitor the air gap and to mathematically correct the JPV signals to a standard gain level. A distance sensor can be used to measure the gap between the sample and the probe; it can be optically based, for example, a laser interferometer, or electrically based measuring the capacitance between the electrodes and the surface junction. The distance information is sent to the computer 12 and the computer will send a signal to the Z motor 19 that moves the probe up and down to compensate for the air gap variation. Distance sensing means comprises a signal generator 20 that applies an AC voltage to the wafer chuck 4, and signal demodulators 11 which connect to the probe electrodes 18 to measure the probe-to-junction capacitance.

In more detail, the first procedure of measurement includes:

a) Placing the calibration semiconductor p-n structure with known capacitance and small leakage current, for example, a deep (>50 um) p-n junction in a 10 Ohm-cm test wafer, on the wafer chuck;

b) Determining the electrode to sample spacing and probe gain level by measurement of the signal voltage from a reference voltage signal on the wafer without light illumination;

c) Illuminating the tested junction area 3 of the product calibration wafer through the end of the fiber 18 connected to a light source 7 with intensity modulated light;

d) Adjustment of the light flux to get linear dependence of the JPV signal, $V_C$, versus light flux;

e) Measuring the JPV signal from the capacitance calibration junction, $V_C$, at frequency f from the electrode 25 using a preamplifier 24 and a signal demodulator 11;

f) Replacing the calibration junction with the junction under test;

g) Measuring the electrode to sample spacing and probe capacitance gain;

h) Use the electrode to sampling spacing information to move the Z motor to maintain the same probe sample spacing as the calibration sample or determine the normalization factor for JPV gain;

i) Repeating the steps c), d), e), f) for the test wafer and measurement of JPV signals $V_t$ from the test area 3 at a frequency f; and j) Determining Io and Cpn using the parameters of the calibration structure Cc, the measured values from the test wafer $V_1$ and from the calibration wafer $V_C$ and equations (6), (7).

For a high throughput, an LED driver 9 and signal demodulators 11 capable of handling two or more frequencies can be used simultaneously, thus reducing steps k) and L) into a single step.

The second procedure of measurement requires an additional measurement of the JPV signals from the tested area 3 with the transparent electrode 18 at frequencies $f_1$ and $f_2$, using the preamplifiers 24 and signal demodulators 11. Io and Cpn are determined using the parameters of the calibration structure Csc, measured values from the test wafer V at frequency $f_1$ and $V_C$ and from the calibration wafer test wafer $V_C$ at frequency $f_1$ and equations (8), (9).

For high throughput, a light source driver 9 and signal demodulators 10 capable of handling two or more frequencies can be used simultaneously, this reducing the measurement time for the dual-frequency method.

An alternative apparatus for this invention uses a transparent dielectric coating over the probe electrode material. The dielectric coating provides a fixed spacing between the probe electrode 25 and the junction surface 3 when the probe is placed into contact with the p-n junction wafer, for a faster probing operation. The electrical effect of this dielectric coating can be determined by placing the coated probe in contact with the p-n junction and measuring the electrode signal from a reference voltage on the test wafer, measured in the absence of the modulated light beam, provided by a voltage supply 20 which can supply a modulated signal through the switch 19 to the wafer chuck 4.

What is claimed:

1. A non-contact method for measurement of leakage current of a p-n junctions of a semiconductor test structure in a scribe line of an IC product wafer comprising:

locating the test structure and moving the test structure beneath a probe electrode, illuminating of a test area of a semiconductor test p-n junction structure with an intensity modulated light to obtain a linear dependence of a JPV signal from a transparent electrode versus light flux, with a photon energy larger than the semiconductor band gap, monitoring junction photo-voltage from the illumination area, means for measuring a reference photo-voltage from the reference p-n structure having a planar p-n diode with a known junction capacitance, measuring the photo-voltage from the test p-n structure using at least two light modulation frequencies, and determining of the leakage current of the test p-n junction structure using the photo-voltage, reference photo-voltage and junction capacitance of the reference p-n structure, wherein the probe-junction distance is fixed by the thickness of a thin transparent insulating layer coating the probe electrode and placed in close proximity with the test p-n junction and where the electrical effect of this dielectric film is determined by a probe capacitance calibration using a known voltage signal applied to the wafer without light illumination.

2. The non-contact method of claim 1 wherein in addition to photo-voltages, phase shifts are measured and the leakage current of the test wafer is determined using the photo-voltages, phase shifts and the reference photo-voltage.

3. The non-contact method of claim 1 where the distance between the p-n junction and the probe electrode is monitored, adjusted and used for the correction of junction photo-voltages for the test and reference wafers.

4. The non-contact method of claim 1 wherein the light flux reflected from the p-n structure is corrected by the photo-voltages from the reference p-n structure taking into account reflectivity differences between these p-n structures.

5. The non-contact method of claim 1 where the reference p-n junction is not leaky, with the leakage $I<10^{-7}$ A/cm$^2$, providing a reference capacitance value.

6. The non-contact method of claim 1 wherein the p-n junction structure is illuminated simultaneously by two light fluxes, modulated at two or more frequencies, and simultaneously detecting and analyzing the relevant photovoltages.

7. The method of claim 1 where the means for locating the test structure is a camera system with imaging capability and pattern recognition software to locate the center of the test structure.

8. The method of claim 1 where the means for moving the test structure beneath a probe electrode uses the information obtained by a camera system to move a motorized stage holding the test structure beneath the probe electrode.

* * * * *